United States Patent [19]

Svilans

[11] Patent Number: 4,660,207
[45] Date of Patent: Apr. 21, 1987

[54] SURFACE-EMITTING LIGHT EMITTING DEVICE

[75] Inventor: Mikelis N. Svilans, Kanata, Canada

[73] Assignee: Northern Telecom Limited, Montreal, Canada

[21] Appl. No.: 673,644

[22] Filed: Nov. 21, 1984

[51] Int. Cl.[4] .......................... H01L 33/00; H01S 3/19
[52] U.S. Cl. ....................................... 372/45; 357/16; 357/17; 372/44; 372/46
[58] Field of Search ....................... 357/17, 16, 29, 55; 372/44, 45, 43, 49, 50, 47, 46

[56] References Cited

U.S. PATENT DOCUMENTS 3,703,670  11/1972  Kunz ...................................... 357/17
4,092,659  5/1978  Ettenberg ............................. 372/49

Primary Examiner—James W. Davie
Assistant Examiner—Georgia Y. Epps
Attorney, Agent, or Firm—Schwartz, Jeffery, Schwaab, Mack, Blumenthal & Evans

[57] ABSTRACT

A surface-emitting, light emitting device has a columnar active region of one direct bandgap semiconductor and a surrounding confining region of a higher bandgap semiconductor. Contacts are made to the active and confining regions and a window is formed in the device in alignment with the active region to permit light emission from the device. The semiconductors are doped to establish a pn junction within a carrier diffusion length of the heterojunction between the active and confining regions, the pn junction extending the length of the active region. In use, light is emitted along the axis of the columnar active region in response to current passing radially across the pn junction.

15 Claims, 17 Drawing Figures

SURFACE-EMITTING LIGHT EMITTING DEVICE

BACKGROUND OF THE INVENTION

1. Field of the Invention

This invention relates to surface-emitting single heterojunction laser/LED structures.

2. Description of Related Art

The importance of vertical laser emission for optoelectronic integration was recognized by, for example, K. Iga et al., 9th IEEE International Semiconductor Conference, 1984, Rio de Janeiro, Brazil, paper D3, p. 52. Vertical laser emission is particularly important in constructing large emitting areas which can be made to have narrow beam angles and high power outputs. Several types of surface-emitting laser are known. Spring-Thorpe et al., International Electron Devices Meeting, (1977) Washington, D.C., p. 571 disclose a standard double heterostructure cavity transverse to current flow. The cavity is electrically pumped over most of its length and two additional mirrors are used to divert the laser beam towards the device surface. K. Iga et al., Electronics Letters, 19, #13 (1983) p. 457 disclose a surface-emitting laser having a cavity perpendicular to the surface but pumped over a short length of the cavity by a pn junction co-planar with the surface.

Finally, Ito et al., Electronics Letters 20 #14 (1984) p. 577, elaborate on the Iga structure by elongating the cavity and introducing additional pumping along its length by a diffused homojunction.

The Ito et al structure, since it has no heterojunction between materials of different bandgap does not have effective carrier and light confinement in comparison with known planar light emitting diodes. Consequently, the laser threshold current of the device is relatively high and the laser slope efficiency is relatively low.

SUMMARY OF THE INVENTION

According to one aspect of the invention, there is provided a surface-emitting, light emitting device having a columnar active region of a first direct bandgap semiconductor material, a confining region of a second semiconductor material surrounding the active region, first and second contacts formed respectively on the active and confining regions, a window in general alignment with the columnar active region to permit light emission from the device, the second material being a higher bandgap material than the first material whereby to confine light and generated current carriers within the active region, the semiconductor materials doped to establish a pn junction within a carrier diffusion length of a heterojunction between the active and confining regions.

The active and confining regions preferably form an epitaxial continuation of a semiconductor substrate with the columnar active region extending longitudinally in a direction generally perpendicular to the plane of the substrate.

The columnar active region can have a circular cross-section which gives minimum astigmatism in the far field intensity profile of emitted light. Ideally such a column has a length in the range from 10 to 100 microns and a diameter in the range from 1 to 10 microns. The semiconductor materials can be group III-V materials such as the gallium arsenide/gallium aluminum arsenide (GaAs/GaAlAs) ternary system or group II-VI materials such as the mercury cadmium tellurium (HgCdTe) ternary system. Preferably the active and confining regions together comprise a single layer of substantially uniform thickness extending perpendicularly to the axis of the columnar active region. For a poorly transmitting material such as the GaAs/GaAlAs ternary system emitting at a wavelength of about 0.84 microns, a well can be etched into the substrate at a location immediately below the column.

The first contact can be a layer of platinum titanium gold (Pt/Ti/Au) deposited on a dielectric layer such as $SiO_2$, $Si_3N_4$, or $Al_2O_3$, the first contact contacting the first surface of the column through a window in the insulating layer. For a circular section column, the contact region can be an annular region adjacent the perimeter of the column top surface, the top window being defined within said annular region, the insulating material being optically transmissive. The second contact is preferably a layer of Au/Ge having a window formed through it in alignment with the column, the top and bottom windows being radially within the device heterojunction. The second contact can alternatively be formed substantially coplanar with, but separated from, the first contact.

Opposed top and bottom surfaces of the column can be made sufficiently reflective that the column can function as a resonant cavity. Alternatively a series of interference films which together function as a mirror can be thin film deposited at the base and the top of the column or can be epitaxially grown in the III-V material during an appropriate stage of epitaxial growth. Particularly for a light emitting device functioning as a laser diode there should be sufficient internal reflection either from mirrors at opposed ends of the active region or from distributed Bragg reflectors located along the length of the active region to form a resonant cavity.

Particularly for a plurality of such devices arranged in a flat array, a high resistivity substrate can be used and devices individually driven, for example, for use in matrix addressed laser thermal printers. Large area arrays can alternatively be constructed in which devices are driven in phase, the devices being epitaxially formed on a common low resistivity substrate.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
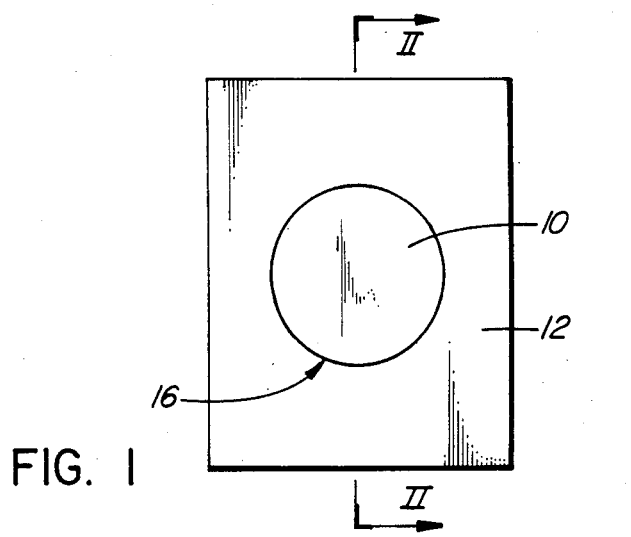
FIG. 1 is a schematic plan view of a light emitting device according to the invention.
Figure 2:
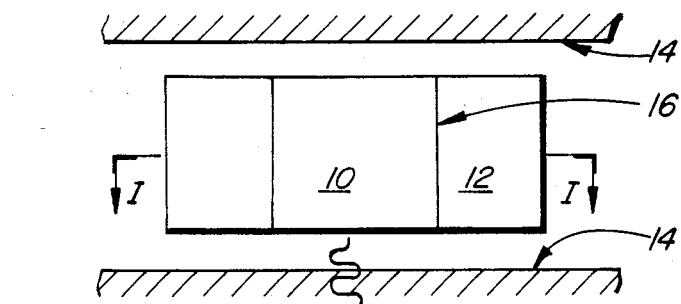
FIG. 2 is a schematic sectional view of the device of FIG. 1.

Referring in detail to the drawings, FIGS. 1 and 2 show a light emitting device having a direct bandgap III-V semiconductor material constituting a device active region 10 and a wider bandgap III-V semiconductor material constituting a device confining region 12. The material in the active region 10 is p-type and the material in the confining region 12 is n-type. The device active region is of columnar shape and above and below it are partially reflecting mirrors 14.

In use, current is directed into the columnar active region 10 across a cylindrical pn junction 16, and into the n-type wider bandgap confining material 12 by electrical contacts which are not shown in FIGS. 1 and 2. Current passing across the pn junction generates current carriers which are injected into the active region 10 in an energized state. When the carriers subsequently return to their low energy state light is emitted. The carriers and light are retained within the cavity since the material of the active region 10 is of a lower bandgap and higher refractive index than those of the confining region 12. The light is partially reflected at opposed mirrors 14 thereby providing optical feedback.

Figure 3:
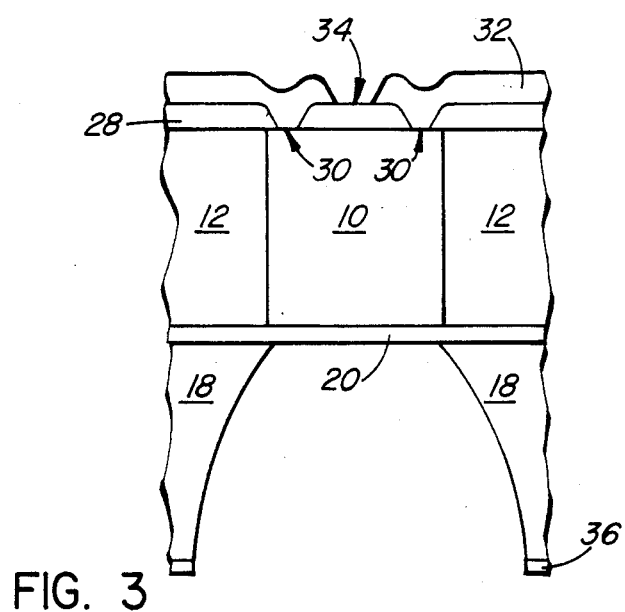
FIG. 3 is a non-scalar, longitudinal sectional view through an implementation of the FIG. 1 device fabricated using the GaAs/GaAlAs ternary III-V system.
Figure 4:
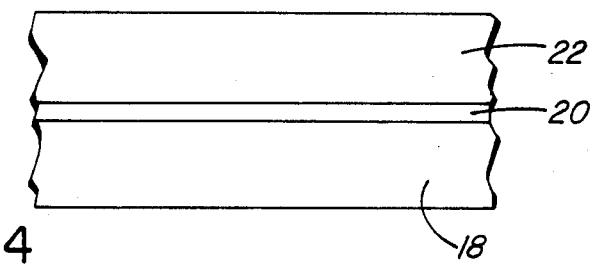
FIGS. 4 to 7 show stages in a fabrication process suitable for making the FIG. 3 device.
Figure 5:
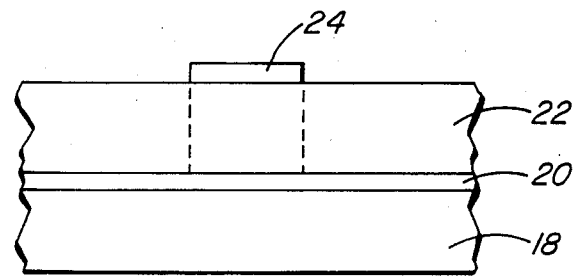
Figure 6:
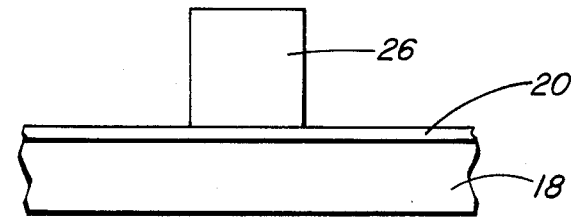
Figure 7:
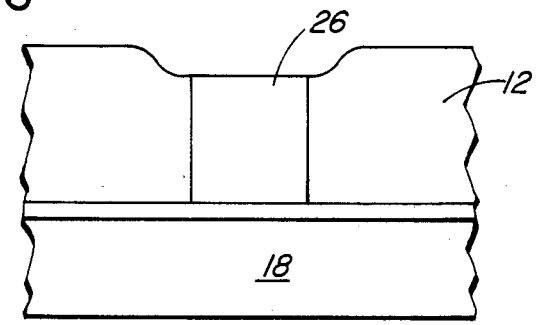

Referring to FIG. 3, there is shown a specific implementation of the schematic structure of FIGS. 1 and 2. The device has an $n^+$-type GaAs 100 micron thick substrate 18 doped to a level of $2.10^{18}\text{cm}^{-3}$. As shown in FIG. 4, epitaxially grown on an upper surface of the substrate is a 1 micron thick etch stop layer 20 of n-type $Ga_{1-x}Al_xAs$ ($x>0.3$) doped to a level of $1.10^{18}\text{cm}^{-3}$ and a 20 micron thick layer 22 of p-type GaAs doped to a level of $1.10^{17}\text{cm}^{-3}$. Layer 22 is etched using a mask 24 (FIG. 5) to leave a column 26 of diameter 5 microns (FIG. 6). Subsequently n-type $Al_yGa_{1-y}As$ ($y=0.35$) doped to a level of $2.10^{17}\text{cm}^{-3}$ is epitaxially grown on the substrate and around the column 10 to a thickness approximately equal to the column height whereby the column 26 and the surrounding region 12 of n-type GaAlAs form a layer of approximately uniform thickness (FIG. 7).

Subsequently an insulating layer 28 of $SiO_2$ is low pressure chemically vapor deposited on the upper surface of the epitaxially grown material to a depth of 2000 angstrom units. As shown by FIG. 3, an annular window 30 is etched through the insulator 28 over the pn junction and zinc is diffused through it into the column top surface. Subsequently a top contact 32 of Pt/Ti/Au is low pressure chemically vapor deposited through a mask onto the top surface of the wafer except over a 3 micron diameter central region 34. In addition, a 1500 angstrom unit layer 36 of Au/Ge is low pressure chemically vapor deposited on the lower surface of the substrate 18. As shown by FIG. 3, using a $H_2O_2{:}H_2SO_4{:}H_2O$ etchant, a well is formed by etching through the bottom contact layer 36 and into the substrate 18 to the etch stop layer 20. GaAs does not transmit light at 0.84 microns, the emission wavelength of the GaAs device so the well obviates undue absorption of light emitted from the active region.

Figure 8:
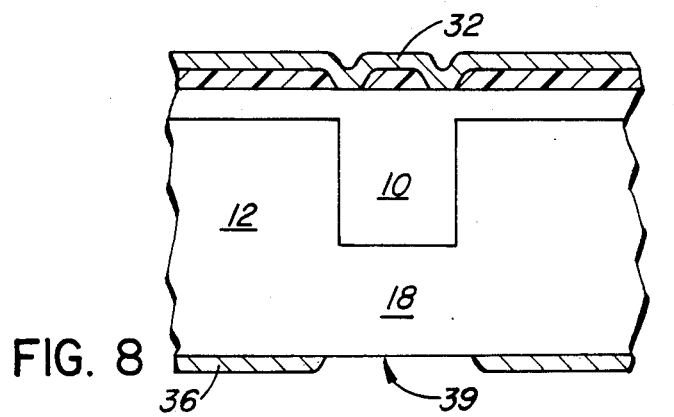
FIG. 8 is a non-scalar, longitudinal sectional view through an implementation of the FIG. 1 device fabricated using the InP/InGaAsP quaternary III-V system.
Figure 9:
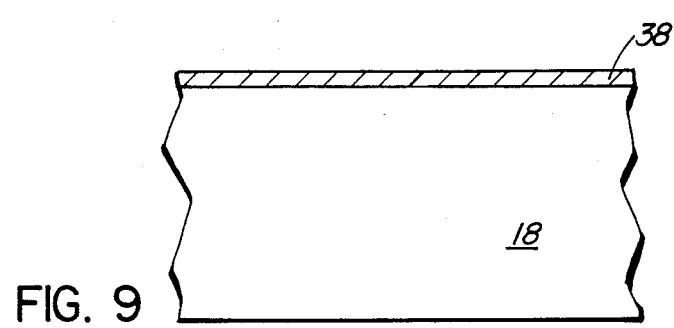
FIGS. 9 to 12 show stages in a fabrication process suitable for making the FIG. 8 device.
Figure 10:
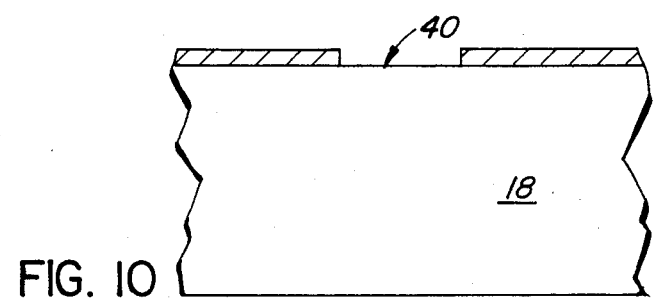

Referring to FIG. 8, there is shown a surface-emitting laser based on the InP/InGaAsP quaternary system having an emission wavelength of 1.3 microns. The device is similar in many respects to the FIG. 3 embodiment. Thus the device has an n-type InP substrate 18 and confining region 12 and a p-type InGaAsP active column 10. However in contrast with the FIG. 3 embodiment, the substrate 18 has no etch-stop layer and no well in alignment with the column 10. The reason for this is that InP is transparent at the device emission wavelength and so light is not unduly absorbed in traversing the substrate 18.

Figure 11:
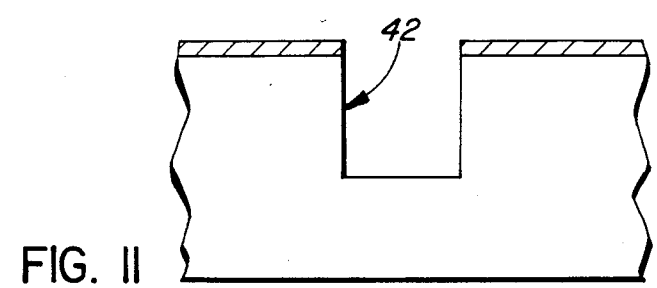
Figure 12:
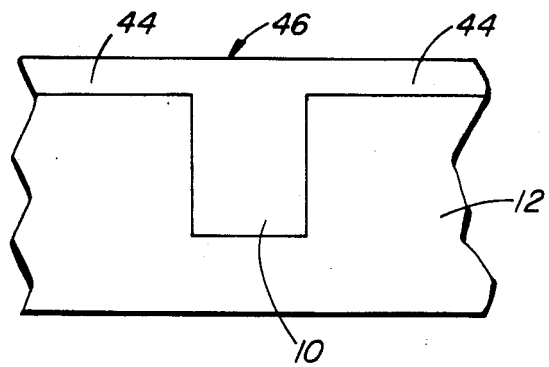

Transparent substrate devices can be fabricated relatively quickly and simply since only a single epitaxial growth step is required. As shown in FIGS. 9 to 13 an n-type InP substrate 18 or an n-type InP epitaxial layer on a semi-insulating substrate is coated with masking material 38 such as $SiO_2$ or $Si_3N_4$. The device active region area 40 is defined photolithographically (FIG. 10), the active region having a cross-sectional shape depending on the required device performance and size related to the carrier diffusion length in the active region. A pit 42 is etched into the InP to a depth of about 20 microns (FIG. 11). A vertical etching method such as reactive ion etching (RIE) or ultra-violet assisted wet chemical etching (UVE) is used to achieve the desired pit shape. An active region 10 of InGaAsP is then epitaxially grown in the pit by, for example, liquid phase epitaxy (FIG. 12). Epitaxial growth 44 can also be promoted over the confining region 12 to produce a wide area continuation of the active region 10. This is useful to obtain a low contact resistance in the working device. If the device is to function as a laser diode, the final growth surface 46 must be relatively flat as it constitutes one of the mirrors of the laser resonant cavity. For light emitting diodes this requirement can be relaxed.

As shown in FIG. 8, contacts to the device can be made essentially as for the FIG. 3 embodiment in which a p-contact 32 is made to the top of the active region 10 and an n-contact 36 for the confining region 12 is applied to the substrate bottom surface. However, in contrast to the GaAs/GaAlAs device, the bottom contact 36 in FIG. 8 is deposited through a mask (not shown) or is deposited as a layer and then locally etched away below the column 10 so as to leave a window 39 for light emission.

Figure 13:
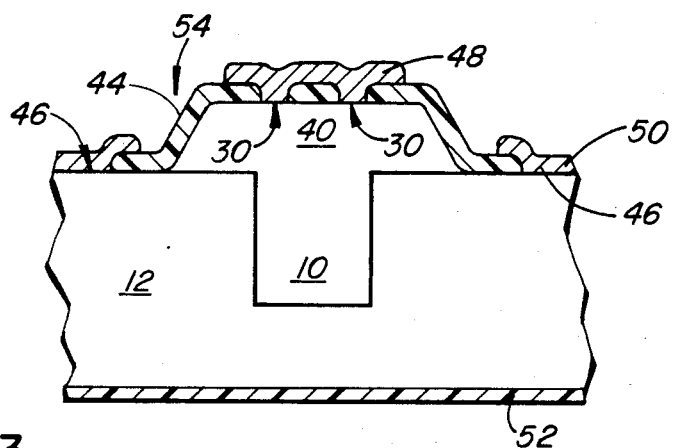
FIG. 13 is a non-scalar, longitudinal sectional view showing the device of FIG. 8 with an alternative contact arrangement.

An alternative contact scheme is shown in FIG. 13. The epitaxially grown semiconductor material forming the active region 10 is etched to leave a central region 40 and an insulating mask layer 44, which can also be a multilayer for better reflectivity, is deposited over the whole wafer. An annular region 30 is then etched in alignment with the active region 10, followed by a zinc diffusion in the case of p-type active region, and metallization 48 for contacting the active region is deposited. Now an area 46 is revealed by etching through the metal 48 and insulator 44 and metallization 50 deposited for contacting the confining region. As now both contacts are shorted, a final etching step is necessary to separate them via a region on the insulator at 54. Either or both the insulating layer 44 and a bottom insulating layer 52 are formed as multilayer mirrors.

Figure 14:
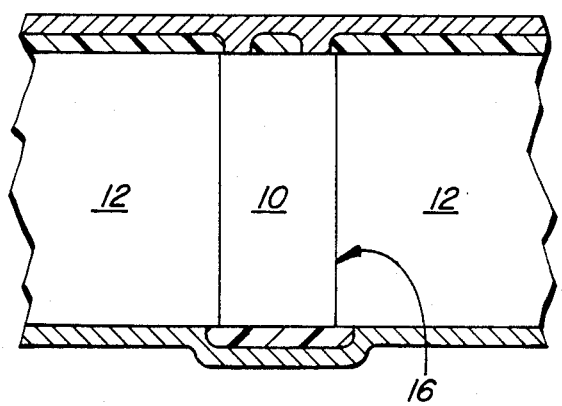
FIG. 14 is a non-scalar, longitudinal sectional view through another embodiment of the device of FIG. 1.

Each of the exemplary devices specifically described has a substrate 18 which serves as the basis for epitaxial growth of the active and confining regions 10 and 12 respectively, and which serves also to physically support these regions. As is clear from FIGS. 1 and 2, in its simplest conceptual form the device does not have a substrate extending perpendicularly to the active region 10. Conditional on adequate physical support from the confining regions 12 then as shown in FIG. 14 the FIG. 1 arrangement can be obtained from the devices shown by removing the lower part of the wafer up to the level at which the pn junction/heterojunction starts. GaAs lasers emitting in the visible part of the spectrum necessarily have crystallographically mismatched layers which severely impedes reliable device fabrication. It has been shown, Yamamoto et al., Applied Physics Letters 41(9), Nov. 1, 1982, that removal of a conventional laser substrate relieves mismatch stress and so improves commercial yield. Although the contact arrangements are essentially those of FIG. 3, the confining region contact can alternatively be made to the side surface instead of to the end face of the confining region (not shown).

Once the wafer is complete to the stage shown in FIGS. 3, 8, 13 or 14, device testing can take place before the wafer is diced into individual light emitting devices or arrays.

An important mode of operation of semiconductor lasers is single frequency (or equivalently single longitudinal mode) operation. In standard lasers, optical feedback is accomplished with semiconductor-air reflecting interfaces, which are relatively insensitive to the laser wavelength. Single longitudinal mode operation can be enhanced if wavelength dependent feedback, formed by several partial reflections interfering constructively according to the Bragg reflection principle, is provided. If the feedback occurs within the active region, these devices are termed distributed feedback lasers (DFB), whereas outside the active region they are generally referred to as distributed Bragg reflectors (DBR), see for example, IEEE Spectrum Dec. 1983, page 43.

Figure 15:
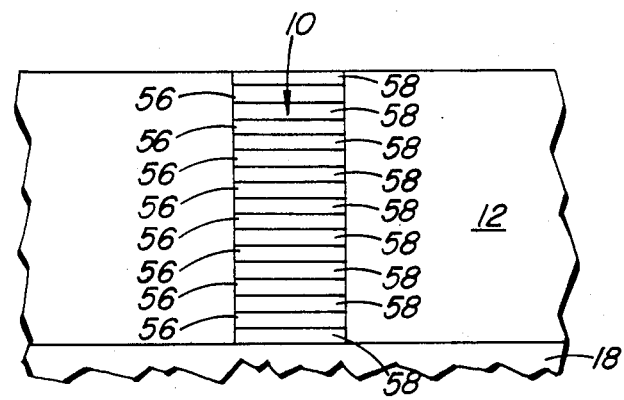
FIG. 15 is a non-scalar, sectional view through a device according to the invention, the device characterized by a distributed feedback (DFB) operation.

Referring to FIG. 15, in order to introduce the Bragg distributed feedback property in the surface-emitting laser of the type previously described, periodic perturbations are introduced into the column as it is epitaxially grown. Molecular beam epitaxy (MBE) or organometallic vapor phase epitaxy (OMVPE) are growth techniques capable of the necessary sub-micron layer thickness control. In one example, for the GaAs/GaAlAs ternary system, epitaxial growth conditions are adjusted so as to grow the active region as alternating layers 56, 58 of narrow bandgap $Al_{0.05}Ga_{0.95}As$ and wider bandgap $Al_{0.1}Ga_{0.9}As$, each layer being of optical thickness $\lambda/2$ where $\lambda$ is the device output wavelength, the confining region 12 having a composition $Al_{0.3}Ga_{0.7}As$.

Figure 16:
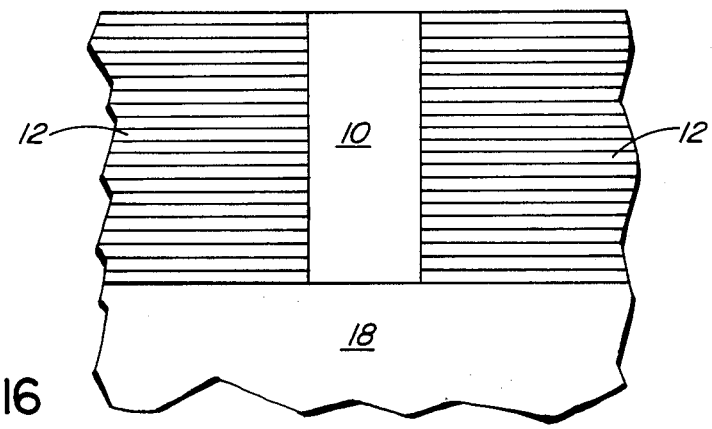
FIG. 16 is a non-scalar sectional view through an alternative device characterized by DFB operation.

The nature of compositions and thicknesses of the alternating layers can be changed in accordance with known Bragg reflection theory to optimize gain and reflection for devices of various dimensions. In fact, as shown in FIG. 16, the compositional changes can exist in the confining region instead of the active region if desired. The compositional changes contribute to optical feedback as long as they are within the region of wave propagation of the laser.

Figure 17:
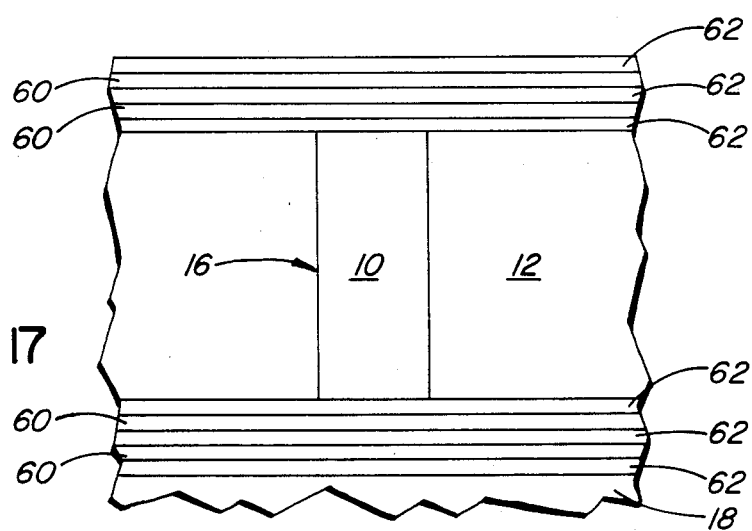
FIG. 17 is a non-scalar, longitudinal sectional view through a device according to the invention, the device characterized by interference mirrors at opposite ends of a laser resonant cavity, providing Bragg distributed reflectors.

Referring to FIG. 17, in a further modification for high gain devices, interference mirrors are formed at each column end in order to enhance reflectivity. The lower mirror is epitaxially grown directly on an InP substrate before growth of active and confining regions 10 and 12. Using epitaxial growth techniques such as MBE and OMVPE enabling accurate thickness control, InP layers 60 alternating with layers 62 of InGaAsP are grown. The interference mirror structures consist of alternating layers differing in composition with each pair of adjacent layers having an optical thickness which is an integer multiple of $\lambda/2$ where $\lambda$ is the device output wavelength. The top mirror can also be epitaxially grown after growth of the active and confining regions 10 and 12 is complete. Alternatively the top interference films can be deposited on the wafer by low pressure chemical vapour deposition.

The structure shown in the Figures has an active volume 10 with a resonant cavity in which oscillation occurs perpendicular to the substrate surface. A pn junction along the cavity length provides carrier injection. Coincident with the pn junction 16 is a heterojunction which provides both carrier and optical confinment. In fact, although the pn junction and the heterojunction are shown coincident, the pn junction can be located radially spaced from the heterojunction as long as it is within the carrier diffusion length of the heterojunction. Clearly from the viewpoint of the fabrication process it is preferred that the heterojunction and the pn junction are coincident and are formed simultaneously. With an active region 10 surrounded by a material 12 of higher bandgap and lower refractive index, a structure having the carrier and optical confinement properties of conventional double heterostructure laser diodes is achieved with a single heterojunction.

The dimensions of the cavity are determined by the intended application. The threshold current, $I_{th}$ increases with increasing column length and increasing column diameter. Transverse mode behaviour is influenced by column diameter and longitudinal mode behaviour by column length. For example, a cavity 5 microns in diameter and 20 microns in length has an injection volume similar to a conventional 200 micron long oxide stripe planar communications laser. With such dimensions the threshold current $I_{th}$ is of similar value to that of the stripe laser but the possiblity of low order or single longitudinal mode output is markedly increased.

Although the active region is shown as a right cylinder, it can in fact depart from that shape. Indeed whether the columnar active region is formed by etching away an epitaxially grown layer to leave a mesa and then growing confining material around the mesa or whether it is formed by etching a pit into confining material and then epitaxially growing an active region in the pit, the process will not normally produce a circular mesa or pit. Some compensation can be achieved by using a shaped mask and permitting meltback during growth to return the mesa or pit to a circular cross-section.

The spacing of the mirrors at each end of the resonant cavity is not critical to the operating principle of the surface emitting structure as applied to lasers. Thus the mirror spacing can be determined by the desired device characteristics and preferred fabrication process. As indicated by FIGS. 15 to 17, the mirrors at either or both ends of the cavity can in fact be replaced by other suitable means for generating optical feedback such as the distributed Bragg reflector or feedback element which may be totally within (FIG. 15) partly within, or totally outside (FIGS. 16 and 17) the active region. The specific embodiments shown are lasers. However as indicated in the description of FIG. 1, if one or both of the mirrors 14 is not present then the device will function as a surface-emitting light emitting diode.

In the examples shown the pn junction is formed at the junction between the p-type columnar active region and the n-type confining region. The conductivity type can however be reversed, the device then having an n-type active region surrounded by a p-type confining layer.

What is claimed is:

1. In a surface-emitting light emitting device, a heterojunction comprising a columnar active region of a first direct bandgap semiconductor material and a confining region of a second semiconductor material surrounding the active region, first and second contacts formed respectively on the active and confining regions, a window in general alignment with the columnar active region to permit light emission from the device, the second material being a higher bandgap material than the first material whereby to confine light and generated current carriers within the active region, the semiconductor materials doped to establish a pn junction within a carrier diffusion length of said heterojunction formed between the active and confining regions.

2. A surface-emitting light emitting device as claimed in claim 1, in which both the active region and the confining region form an epitaxial continuation of a semiconductor substrate.

3. A surface-emitting device as claimed in claim 2, the columnar active region extending longitudinally in a direction generally perpendicular to the plane of the substrate.

4. A device as claimed in claim 3 in which the columnar active region has a circular cross-section.

5. A device as claimed in claim 1 in which the semiconductor materials are group III-V materials.

6. A device as claimed in claim 5, the device having a GaAs substrate, a p-type GaAs active region and an n-type GaAlAs confining region.

7. A device as claimed in claim 1 in which the columnar active region occupies a pit within a mass of the second semiconductor material.

8. A device as claimed in claim 2, in which the active and confining regions together comprise a layer of substantially uniform thickness on the substrate.

9. A device as claimed in claim 2, the device having a well etched into a rear face of the substrate at a location generally vertically aligned with the columnar active region.

10. A device as claimed in claim 1 in which an insulating layer overlies a top surface of both the active and confining regions and the first contact contacts the top surface of the active region through a window in the insulating layer.

11. A device as claimed in claim 10, the active region being a circular section column, the contact region being an annular region adjacent a perimeter of the column top surface.

12. A device as claimed in claim 11 in which a top light emitting window is defined radially within said annular region, the insulating layer being optically transmissive at the emission wavelength of the device.

13. A device as claimed in claim 1, further comprising reflective elements at opposed ends of the columnar active region, the elements defining with the active region a laser resonant cavity.

14. A surface-emitting device as claimed in claim 1 in which the pn junction extends along the length of the heterojunction.

15. A surface-emitting light emitting device as claimed in claim 1 in which the first and second contacts are formed at a common surface of the device, the contacts being substantially co-planar and spaced from one another.

* * * * *